United States Patent [19]

Yaeli

[11] Patent Number: 4,797,894
[45] Date of Patent: Jan. 10, 1989

[54] ALIGNMENT METHOD AND ARRANGEMENT FOR EXTERNAL OPTICAL FEEDBACK FOR SEMICONDUCTOR DIODE LASERS

[75] Inventor: Joseph Yaeli, Haifa, Israel

[73] Assignee: Xerox Corporation, Stamford, Conn.

[21] Appl. No.: 88,178

[22] Filed: Aug. 21, 1987

[51] Int. Cl.$^4$ ............................................. H01S 3/08
[52] U.S. Cl. .................................. 372/92; 372/33; 372/99
[58] Field of Search ................ 372/43, 50, 92, 99, 372/103, 107, 108, 33

[56] References Cited

U.S. PATENT DOCUMENTS

| | | | |
|---|---|---|---|
| 4,594,719 | 6/1986 | Ackley | 372/50 |
| 4,656,641 | 4/1987 | Scifres et al. | 372/103 |
| 4,719,630 | 1/1988 | Streifer | 372/18 |

OTHER PUBLICATIONS

Renner et al., "Simple System for Broad-Band Single Mode Tuning of D.H. GaAlAs Lasers", Electronics Letters, Feb. 1, 1979, vol. 15, No. 3, pp. 73–74.

E. M. Belenov et al, "Methods for Narrowing the Emission Line of an Injection Laser", Soviet Journal of Quantum Electronics, vol. 13(6), pp. 792–798, Jun., 1983.

Primary Examiner—William L. Sikes
Assistant Examiner—B. Randolph
Attorney, Agent, or Firm—W. Douglas Carothers, Jr.

[57] ABSTRACT

A semiconductor diode laser has at least one output beam emitted from an emission aperture from a facet of the laser. An external optical feedback resonator redirects the output beam back into the laser emission aperture. The resonator comprises a reflective surface mirror on the facet laterally adjacent to the laser emission aperture and a spherical mirror spatial positioned from the laser facet to receive the output beam and image the same onto the facet mirror and, then, reimage the beam reflected from the facet mirror back into the laser emission aperture. The improvement comprises the spherical mirror being spaced from the center of the facet a distance substantially equal to the radius of curvature of the mirror so that the reimaging of the beam provides a spot size substantially equal to the spot size of the emission aperture or the beam waist, $W_0$, at the laser facet. The alignment of the spherical mirror relative to the laser facet in directions laterally of and rotationally about the radius of curvature of the spherical mirror is insensitive to limited relative movement between the spherical mirror and the laser in those directions.

19 Claims, 4 Drawing Sheets

ALIGNMENT METHOD AND ARRANGEMENT FOR EXTERNAL OPTICAL FEEDBACK FOR SEMICONDUCTOR DIODE LASERS

BACKGROUND OF THE INVENTION

This invention relates to semiconductor diode lasers and diode array lasers, e.g. phase locked array lasers, and more particularly to a method and arrangement for ease of alignment in providing efficient optical feedback to the emitting aperture of the laser while insensitive to limited misalignment between the laser and its external optical cavity feedback resonator. The alignment method of this invention also has application with a phased laser array to bring about and maintain fundamental supermode operation of phase locked array lasers.

It is known in the art to provide an external optical cavity with feedback means in the form of an external mirror wherein the output beam from a light source, such as a laser, is reflected back into the emitting region of the laser to provide stimulation emission of the laser. Such feedback means may be more sophisticated in the case of stabilizing the far field dominate lobe so that no beam shift occurs during continuous laser operation. See, for example, U.S. Pat. No. 4,656,641.

An article of E. M. Belenov et al entitled, "Methods for Narrowing the Emission Line of an Injection Laser", *Soviet Journal of Quantum Electronics*, Vol. 13(6), pp. 792–798, discloses various schemes of external optical resonator to provide feedback for the purpose of achieving the narrowing of the emission line or wavelength emission spectra of an injection or diode laser. One such scheme is shown in FIG. 1(d) of this reference employing an external resonator for an injection laser using a spherical mirror and reflective coating on regions of the laser facet adjacent to the point of beam emission from the laser. In seeking out the purpose of narrowing the laser wavelength emission spectra, E. M. Belenov et al employ an external cavity which provides a small amount of feedback. In this case, the length, L, between the laser facet and the spherical mirror is required not to be equal to the radius of curvature of the spherical mirror, i.e., $R \neq L$. This scheme established an external cavity in which the Gaussian beam waist, $W_0$, at the facet is much greater than the extent of the emitting active region. E. M. Belenov et al state that it should be comparable to or substantially equal to the size of the facet mirror. Also, the reimaged spot at the laser emission point aperture overlaps the latter to a great extent so that only a small amount of the feedback radiation is fed into the smaller laser emission aperture. This follows from the further fact that the Belenov et al article reports that R, the radius of curvature of the spherical mirror, should be greater than L, the distance between the laser facet and the plane of the spherical mirror, so that the beam waist at the facet, $W_0$, is large. Also, the parameter $a^2$, the feedback efficiency, for this particular embodiment is preferred to be $a^2 \leq 10^{-2}$, which is a=0.1, i.e., a very low feedback efficiency (1% or less). As a result, there will be no focus, let alone high efficient, reimaging of the reflected beam back into the laser emission aperture since a majority portion of the reimaged beam will be out of the field or spot size of laser emission aperture. As a result, any significant sensitivity to misalignment relative to spatial relationship of the laser facet to the spherical mirror in a direction perpendicular to the axis, L, can only be realized by actually providing a unfocused beam as optical feedback in order to achieve a small amount of feedback for the purpose of changing the wavelength emission spectra with an additional advantage of lower sensitivity to misalignment within the limits of the larger feedback beam spot size on a much smaller emission aperture size.

The object of this invention is the provision of external optical feedback means designed for high efficient feedback of 90% or greater of the emitted radiation from the laser facet back into its aperture while being insensitive to limited misalignment of the laser facet relative to the spherical mirror to obtain high levels of optical feedback into the laser emission aperture without the need of fine tuned alignment.

This general object and other more specific objects of this invention will become apparent from the following description of this invention.

SUMMARY OF THE INVENTION

According to this invention, a semiconductor diode laser, having at least one output beam emitted from an emission aperture at a facet of the laser, is provided with an external optical feedback resonator to redirect the output beam back into the laser emission aperture. The external optical feedback resonator comprises a reflective surface mirror on the facet adjacent to the laser emission aperture and a spherical mirror spatial positioned to a distance, L, from the plane of the laser facet. The spherical mirror receives the output beam from the laser emitter and images the same onto the facet mirror and, then, reimages the beam reflected from the facet mirror back into the emission aperture of the laser. The improvement in this invention comprises the spherical mirror being spaced from the center of the facet a distance substantially equal to the radius of curvature, R, of the spherical mirror, i.e. L=R, so that the reimaging of the beam provides a spot size substantially equal to the spot size of the emission aperture. The alignment of the spherical mirror relative to the laser facet in directions laterally of and rotationally about the radius of curvature is insensitive to limited relative movement between the spherical mirror and the laser in those directions.

The insensitivity to such relative movement is optimum in a direction that is perpendicular to the radial axis of the spherical mirror and is in alignment with the alignment direction of the laser emission aperture and the facet mirror. The extent of the insensitivity to such relative movement in this defined direction is approximately limited to one half of the length of the laser facet mirror in that direction because a movement of $\Delta Y$ at the spherical mirror causes a movement of $2\Delta Y$ of the focused image at the laser facet mirror.

In a further embodiment of this invention, a mask is positioned in front of the spherical mirror with its aperture aligned relative to the emission aperture of the laser to permit the passage of only the dominate lobe in the far field pattern of the laser.

An antireflective (AR) coating may be applied to the region of the laser facet including the facet emission aperture to increase the effectiveness of the external optical feedback resonator.

A further embodiment of this invention comprises a multi-emitter semiconductor diode array laser, having a plurality of output beams from a plurality of aligned emission apertures from the laser facet, employed in combination with the external optical feedback resonator described above to reimage the output beams of the individual emitters fully back into their respective emission apertures without misalignment sensitivity due to, for example, any differences in spacing between the aligned laser emitters. A mask may be positioned in front of the spherical mirror having an aperture aligned relative to the far field pattern of the combined output of array laser so as to limit the passage of only a selected supermoded, e.g. the fundamental supermode, in the far field pattern.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 6 is a modified embodiment of the plan view shown in FIG. 3.

DETAILED DESCRIPTION OF THE PREFERRED EMBODIMENTS

Figure 1:
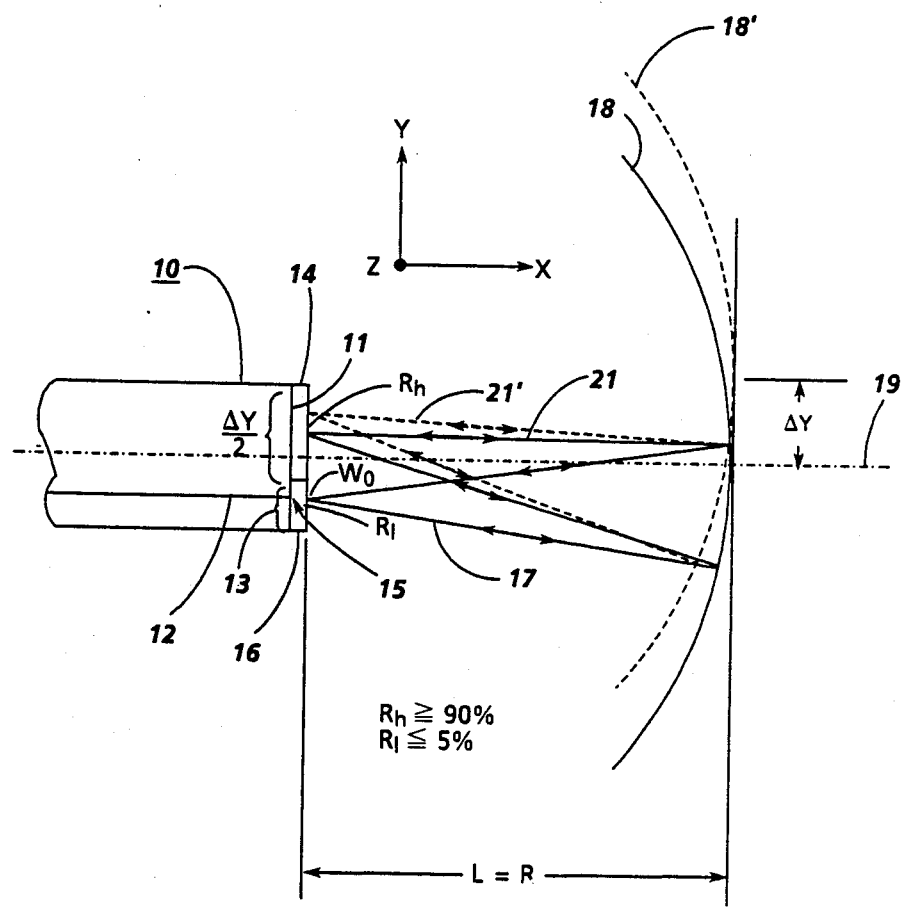
FIG. 1 is a schematic illustration of a side elevation of an embodiment of this invention.

Reference is now made to FIG. 1 wherein there is illustrated a diode laser 10 and external optical resonator arrangement. Laser 10 comprises a heterojunction device having an active region wherein carrier recombination and light generation occurs supporting light propagation under lasing conditions. Laser 10 may be of any type of semiconductor laser, lasing at any desired wavelength and having any type of geometrical form of stripe or current confinement configuration, such as single stripe, an array of stripes, a matrix of stripes, the latter case being of particular interest for producing an output beam of narrow limits in both orthogonal directions.

Laser 10 has a front facet 26 (not shown in FIG. 1) and a rear facet 11. Laser beam 17 emits at a rear facet at emission aperture 15. Rear facet 11 in region 13 includes the emission aperture 15 and carries an antireflection (AR) coating 16 having a low reflectance value, $R_1$, for example, less than 5%. The remaining portion of facet 11 is provided with a highly reflective coating forming a facet surface mirror 14 having a high reflectance value, $R_h$, for example, of 90% or greater.

The division of region 13 and facet surface mirror 14 on facet 11 is not critical and may be, for example, 50%-50% or 70%-30%, as approximately illustrated in FIG. 1.

Laser 10 is provided with an external optical feedback resonator utilizing in combination a concave spherical mirror 18 having a radius of curvature, R, and facet mirror 14. As depicted in FIG. 1, spherical mirror 18 is positioned with its 19 at a distance of L=R from facet 11 and offset relative to the axis of active region 12. Spherical mirror 18 is aligned with respect to laser 10 and its facet 11 so that 19 is on facet 11 spaced laterally from aperture 5 toward facet mirror 14. As an example, 19 may be just off alignment with active region 12 and aperture 15 or at any point midway between aperture 15 and and the center of facet mirror 14. An image of output beam 17 is formed on facet mirror 14, via beam reflected beam 21 and reflected back to aperture 15 via mirror 18. 90% or more of the total intensity of this facet image is reflected back into aperture 15 providing a high level of optical feedback. The principal advantage of this resonator arrangement is the relative insensitivity of alignment of 19 of mirror 18 in the plane of laser facet 11. As a result, there is only a need to focus in the direction of 19, i.e., adjusting for L=R, with a definite position for optimum performance. As long as the lateral positioning of mirror 18 relative to center of curvature 19 or the rotational orientation of mirror 18 about center of curvature 19 is such that the reflected image of beam 17 is always reimaged on the surface of facet 11, its coordinates on facet 11 are not important.

In summary, with spherical mirror 18 positioned from laser facet 11 at L=R, misalignment of spherical mirror 18 relative to laser facet 11 in a direction laterally of and rotationally about center of curvature 19 and parallel to the plane of facet 11 is insensitive to relative movement between them. As depicted in FIG. 1, when, for example, spherical mirror 18 is moved to the dotted line position 18' and reflected beam 21' is within the range of such lateral movement in the Y axis direction, the reimaged beam is still focused to be contained and fully fed back into emission aperture 15. The insensitivity will be optimum in the Y axis direction, although the beam 17 would still reflect from mirror 14 if movement of spherical mirror 18 is confined to lateral movement in other directions perpendicular to axis 19 and parallel to the plane of facet 11 and the engagement of reflected beam 21 is still somewhere on the surface of facet 11, preferably somewhere on the surface of mirror 14. In other words, the movement of mirror 18 in a plane parallel to the Y-Z plane will function to be insensitive to lateral misalignment as long as the reflected beam 21' is within the boundaries of engagement with the surface of facet 11 and with sufficient degree of reflectivity of beam 21' as feedback to the active region 12 of laser 10.

The extent, for example, of permissible misalignment in the Y direction, $\Delta Y$, is limited by the length of facet mirror 14 in the same Y direction, being equal to $\Delta Y/2$. In other words, the amount of misalignment of mirror 18 in the Y direction is one half of the length of mirror 14 in the Y direction since any change $\Delta Y$ at mirror brings about a change of $2\Delta Y$ at facet mirror 14.

Figure 1A:
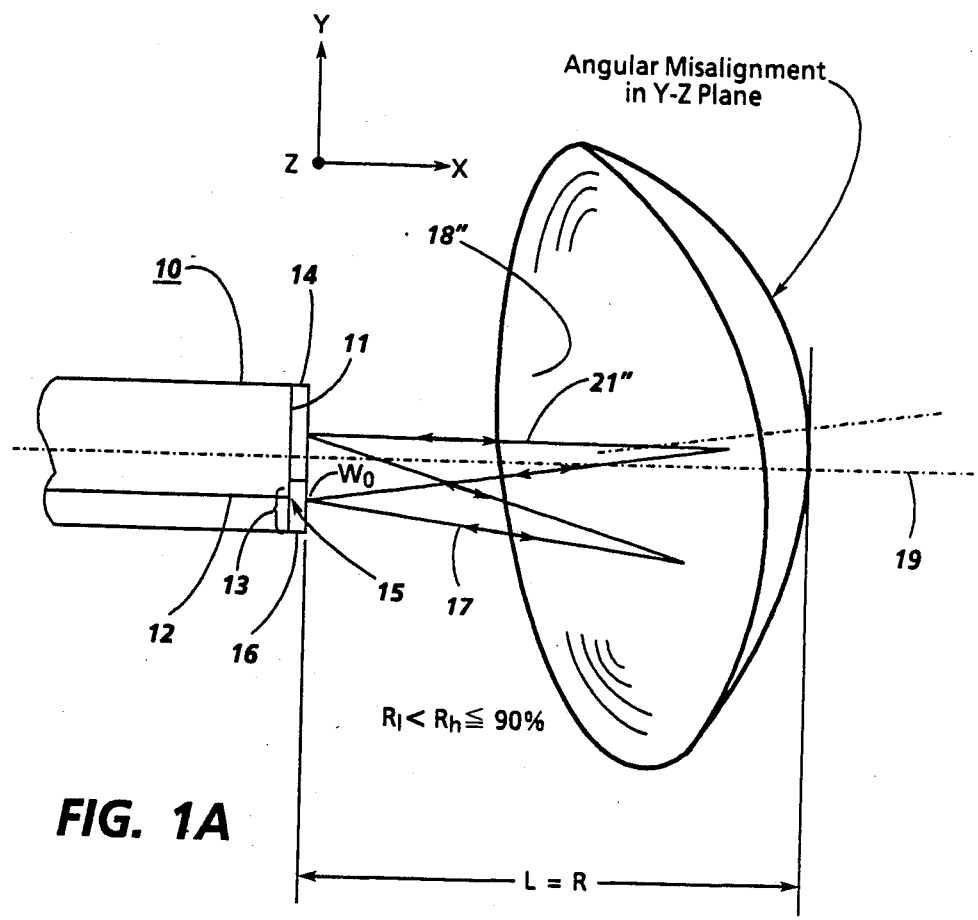
FIG. 1A is another schematic illustration of a side elevation of an embodiment of this invention.

By the same token, when spherical mirror 18 is rotated about 19, such as illustrated in FIG. 1A tilted in the Y-Z plane for mirror 18'', the reflected or reimaged beam 21'' is within the range of such rotational orientation and is still focused to be contained and fully fed back into emission aperture 15. Such rotational orientation misalignment in the Y-Z plane will function to be insensitive to limited rotational orientation misalignment as long as reflected beam 21'' is within the boundaries of engagement with the surface of facet 11 and with sufficient degree of reflectivity of beam 21'' as feedback to the active region 12 of laser 10.

The foregoing attributes concerning misalignment as well as the various components comprising the arrangement of this invention are also applicable to the embodiments set forth in FIGS. 2-6.

Figure 4:
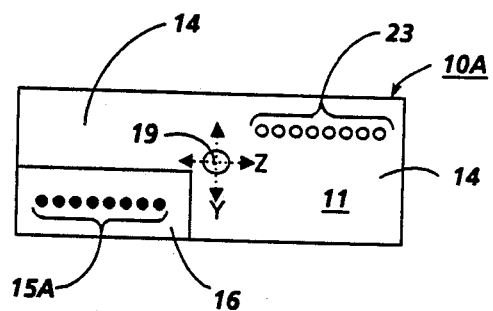
FIG. 4 is a rear facet elevation of the array laser shown in FIGS. 2 and 3.
Figure 2:
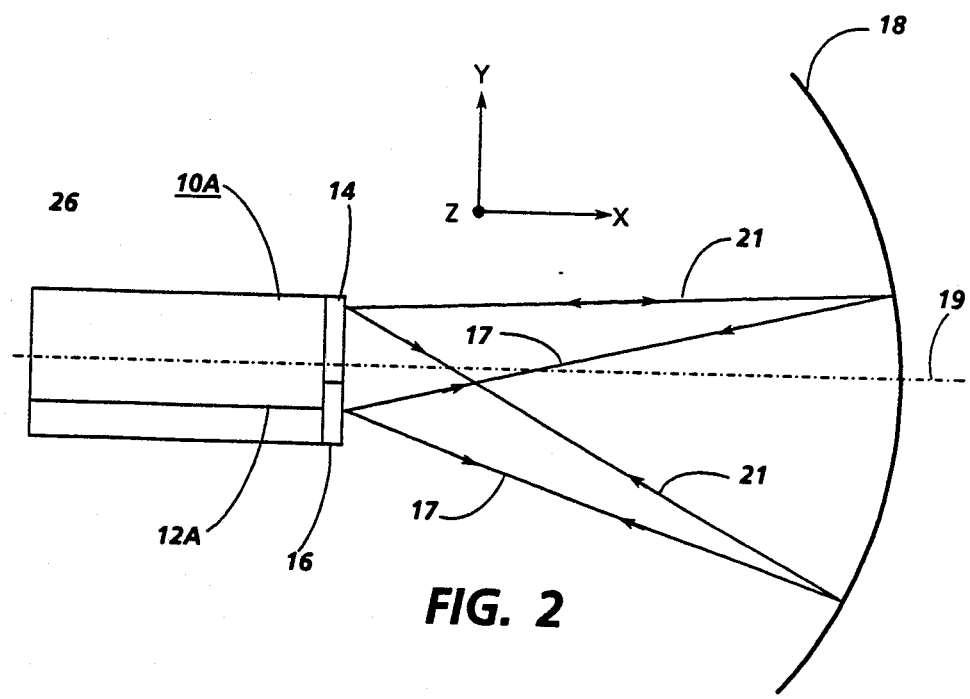
FIG. 2 is a schematic illustration of a side elevation of a further embodiment of this invention utilizing an array laser.
Figure 3:
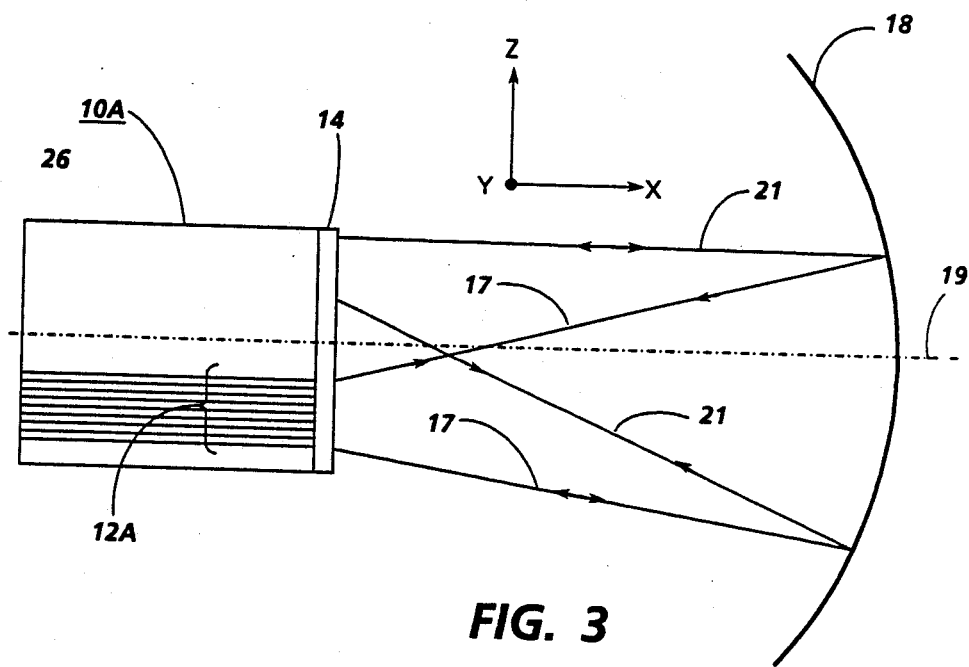
FIG. 3 is a plan view of FIG. 2.

Reference is now made to FIGS. 2-4 disclosing an optical feedback resonator in combination with a multiple emitter array laser 10A, instead of a single emitter laser. Laser 10A comprises a plurality of spatially separated lasers, as represented by stripes 12A, having a plurality of emitters at emission apertures 15A shown in FIG. 4. An output beam from front facet 26 of laser 10A may be employed in a particular application while output beam 17 from back facet 11 is employed to stabilize the beam mode operation. The principal of operation of spherical mirror 18 and facet mirror 14 at back facet 11 is identical to that shown in FIG. 1 except that a plurality of emitters 15A are involved in feedback with output beam 17 reflected by mirror 18 onto facet mirror 14 forming images 23 which are, thence, reimaged via mirror 18 back into the respective emission apertures 15A.

Figure 5:
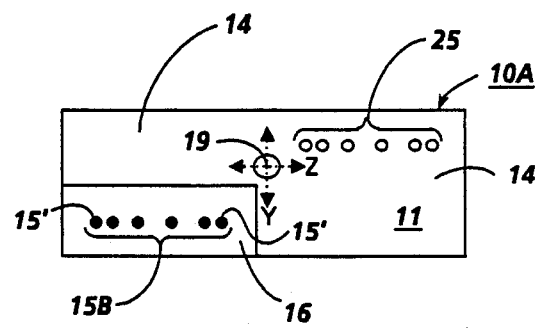

An important aspect and advantage of this invention is that, in spite of any variances in the distance between respective emitters 15A, mirror 18 will reimage each respective output beam totally back into its respective emission aperture with maximum full beam feedback, for example 90% or greater, regardless of any lateral misalignment of mirror 18 relative to facet 11 in either the Y axis or the Z axis directions or in any other directions in the Y-Z plane within the boundaries of facet mirror 14. In this connection, there are multiple emitter array lasers provided with emitters that are intentionally not uniformly spaced from one another. Such a varied spacing between emitters is illustrated in FIG. 5. An example of varied spacing between emitters is illustrated in U.S. Pat. No. 4,594,719. The emitter arrangement shown in FIG. 5 has end emitters 15' spaced more closely together than the uniform spacing provided between the remaining intermediate emitters so that the far field pattern has a characteristic rectangular intensity envelope as taught in U.S. patent application Ser. No. 843,485, filed Mar. 24, 1986, now U.S. Pat. No. 4,719,630, owned by the assignee herein and incorporated herein by reference thereto. The reimaged spots 25 of the plural beams of nonuniformly spaced emitters 15B will be accurately fed back into their corresponding emission apertures 15B regardless of any misalignment of mirror 18 relative to laser facet 11 in either the Y axis or Z axis directions or in any other directions in the Y-Z plane within the boundaries of facet mirror 14.

Figure 6:
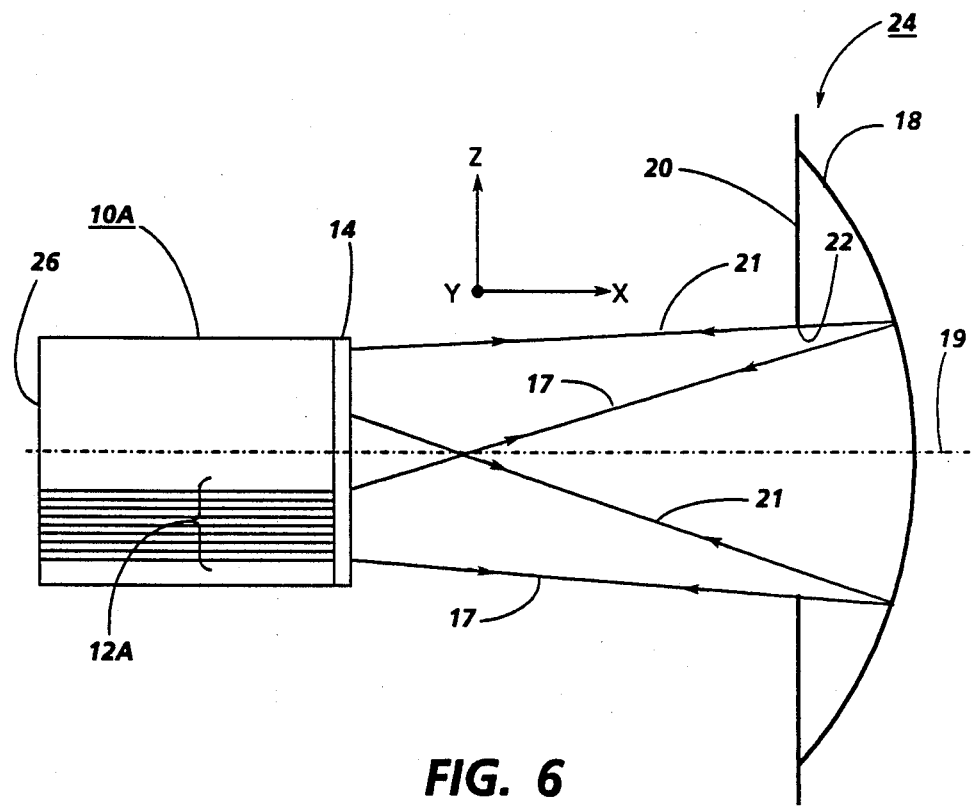
FIG. 6 is a rear facet elevation of an array laser similar to that shown in FIG. 5 except having multiple emitters with nonuniform spatial separation therebetween.

The arrangement shown in FIG. 6 has special application relative to multiple emitter lasers that are operating under phase locked conditions. Such array lasers usually have a combination of supermodes equal to the number of emitters in the array. The arrangement in FIG. 6 will permit operation of phase locked array laser 10B with single, fundamental supermode operation with only one lobe in the far field pattern being fed back to emission apertures 15A or 15B. This arrangement includes mask 20 positioned to enable only the desired mode to have feedback and accordingly shape the laser mode of operation to the selected mode. Mask 20 has a slit or side edge 22 to accommodate mode selection. lateral adjustment of assembly 24, comprising the integral combination of mirror 18 and mask 20, can be accomplished to permit passage therethrough of only the selected mode. The use of assembly 24 becomes highly advantageous because laser 10B and assembly 24 can be packaged together by being permanently fixed to a single base in the X axis direction with final adjustments made for lateral alignment in the perpendicular Y-Z plane for alignment of assembly 24 to properly adjust for passage of the fundamental mode in the far field pattern without the necessity for consideration for lateral misalignment of mirror 18 relative to facet 11. Fundamental mode feedback to emitters 15A or 15B provides for stable single mode operation of laser 10B and single lobe far field pattern in the output beam from front facet 26.

Thus, assembly 25 has significant advantage to provide precise tuning of a phase locked array laser to single lobe mode operation without the need to consider sensitivity to lateral misalignment in adjusting for this operation.

Mask 20 may be modified depending upon the laser employed. For example, a matrix stripe geometry may require that slit 22 be of an ellipse or oval shape to limit beam passage to the desired radiation pattern.

Furthermore, the arrangement of this invention is not limited to just semiconductor diode lasers as discussed herein and identified in the claims. The arrangements shown may be readily extended by any crystalline type lasers, such as Nd YAG laser or to any noncrystalline type laser, such as gas lasers or a combination laser medium with one mirror parallel to the surface of the lasing medium comprising the mirror resonator arrangement of this invention.

While the invention has been described in conjunction with a few specific embodiments, it is evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. In a semiconductor diode laser having at least one output beam emitted from an emission aperture from a facet of said laser, external optical feedback means to redirect said output beam back into said laser emission aperture and comprising a reflective surface mirror on said facet laterally adjacent to said emission aperture and a spherical mirror spatial positioned from said laser facet to receive said output beam and image the same onto said facet mirror and reimage said beam reflected from said facet mirror back to said emission aperture.
   the improvement comprising said spherical mirror being spaced from the center of said facet a distance substantially equal to the center of curvature of said mirror so that the reimaging of said beam provides a spot size substantially equal to the spot size of said emission aperture, the alignment of said spherical mirror relative to said laser facet in directions laterally of and rotationally about said radius being insensitive to limited relative movement between said spherical mirror and said laser in said directions.

2. The diode semiconductor laser of claim 1 wherein said insensitive relative movement is optimum in a direction that is perpendicular to said center of curvature and is in alignment with the alignment direction of said facet aperture and said facet mirror, the extent of said insensitive relative movement in said direction of said spherical mirror relative to said laser facet is approximately limited by one half of the length of said laser facet mirror.

3. The semiconductor diode laser of claim 1 wherein a mask is positioned in front of said spherical mirror and having an aperture aligned relative to said emission aperture to permit the passage of the dominate lobe in the far field pattern of said laser.

4. The semiconductor diode laser of claim 1 wherein an AR coating is applied to a region of said facet that includes said emission aperture.

5. The semiconductor diode laser of claim 1 comprising a multi-emitter laser having a plurality of output beams from a plurality of emission apertures from said laser facet, said output beams being reimaged from said facet mirror back into their respective emission apertures.

6. The multi-emitter semiconductor diode laser of claim 4 wherein a mask is positioned in front of said spherical mirror and having an aperture aligned relative to said emission apertures to permit the passage of a single lobe in the far field pattern of said laser.

7. The multi-emitter semiconductor diode laser of claim 4 wherein an AR coating is applied to a region of said facet that includes said emission apertures.

8. The method of providing high efficient external optical feedback resonator for at least one output beam from a semiconductor diode laser having sensitivity to lateral misalignment between the laser and the external optical feedback mechanism comprising the steps of:
providing a spherical mirror as one part of the external optical feedback mechanism for said laser having a center of curvature, R,
providing a surface mirror on the laser facet laterally adjacent to said emission aperture of said laser as another part of the external optical feedback mechanism,
adjusting the length, L, between said laser facet and the center of curvature of said spherical mirror to be equal to R,
positioning the longitudinal central radial axis of said spherical mirro to be at the midway point between said laser emission aperture and said facet surface mirror,
reimaging all of said output beam from said laser reflected from said facet surface mirror back into said laser emission aperture, said reimaging being insensitive to lateral and rotational misalignment of said spherical mirror center of curvature relative to said midway point in a direction represented by the direction of alignment of said facet emission aperture and said facet surface mirror.

9. The method of claim 8 including the further step of:
providing a muti-emitter laser having a plurality of output beams from a plurality of emission apertures from said laser facet,
reimaging the far field pattern of combined output beams from said facet surface mirror back via said spherical mirror into said laser emission apertures, and
limiting the extent of said far field pattern to a dominate lobe in said far field pattern.

10. The method of stabilizing fundamental supermode operation of a phase locked array laser having an emitting facet and a plurality of emission apertures producing a combined output beam having a far field pattern comprising the steps of:
providing an optical feedback resonator comprising a concave spherical mirror having its radial center of curvature spaced from said emitting facet of the laser a distance substantially equal to the radius of its curvature and a facet mirror on the surface of said laser facet adjacent to said apertures,
providing a mask in front of said spherical mirror having an aperture therein to permit the passage of a portion of said output beam,
mounting said mask and spherical mirror as an integral assembly for incremental lateral movement in a plane perpendicular to said radial center of curvature and parallel to the plane of said laser facet, and
adjusting the lateral position of said assembly relative to permit the passage of only the fundamental mode in said far field pattern through said mask aperture.

11. In a semiconductor diode laser having at least one output beam emitted from an emission aperture from a facet of said laser, external optical feedback means to redirect said output beam back into said laser emission aperture and comprising a reflective surface mirror at position substantially at the plane of said facet and spherical focus means spatial positioned from said laser facet to receive said output beam and image the same onto said surface mirror and reimage said beam reflected from said surface mirror back to said emission aperture,
the improvement comprising said spherical focus means being spaced from the center of said facet a distance substantially equal to the center of curvature of said mirror so that the reimaging of said beam provides a spot size substantially equal to the spot size of said emission aperture, the alignment of said spherical focus means relative to said laser facet in directions laterally of and rotationally about said center of curvature insensitive to limited relative movement between said spherical focus means and said laser in said directions.

12. The diode semiconductor laser of claim 11 wherein said insensitive relative movement is optimum in a direction that is perpendicular to said center of curvature and is in alignment with the alignment direction of said facet aperture and said surface mirror, the extent of said insensitive relative movement in said direction of said spherical focus means relative to said laser facet is approximately limited by one half of the length of said surface mirror.

13. The semiconductor diode laser of claim 11 wherein a mask is positioned in front of said spherical focus means and having an aperture aligned relative to said emission aperture to permit the passage of dominate lobe in the far field pattern of said laser.

14. The semiconductor diode laser of claim 11 wherein an AR coating is applied to the region of said facet containing said emission aperture.

15. The semiconductor diode laser of claim 11 comprising a multi-emitter laser having a plurality of output beams from a plurality of emission apertures from said laser facet, said output beams being reimaged from said surface mirror back into their respective emission apertures.

16. The multi-emitter semiconductor diode laser of claim 15 wherein a mask is positoned in front of said spherical focus means and having an aperture aligned relative to said emission apertures to permit the passsge of a single lobe in the far field pattern of said laser.

17. The multi-emitter semiconductor diode laser of claim 16 wherein an AR coating is applied to a region of said facet that includes said emission apertures.

18. The method of providing high efficient external optical feedback resonator for at least one output beam from a semiconductor diode laser having insensitivity to lateral misalignment between the laser and the external optical feedback mechanism comprising the steps of:

provinding a spherical focus means as one part of the external optical feedback mechanism for said laser having a center of curvature, R, providing a surface mirror at the vicinity of the laser facet and laterally adjacent to said emission aperture of said laser as another part of the external optical feedback mechanism, adjusting the length, L, between said surface mirror and the center of curvature of said spherical focus means to be equal to R, positioning the longitudinal central radial axis of said spherical focus means to be at the midway point between said laser emission aperture and said surface mirror, reimaging all of said output beam from said laser reflected from said surface mirror back into said laser emission aperture, said reimaging being insensitive to lateral and rotational misalignment of said spherical focus means center of curvature relative to said midway point in a direction represented by the direction of alignment of said facet emission aperture and said surface mirror.

19. The method of claim 18 including the further step of:

providing a multi-emitter laser having a plurality of output beams from a plurality of emission apertures from said laser facet, reimaging the far field pattern of combined output beams from said surface mirror back via said spherical focus means into said laser emission apertures, and limiting the extent of said far field pattern to a dominate lobe in said far field pattern.

* * * * *